(12) United States Patent
Granig et al.

(10) Patent No.: US 9,705,486 B1
(45) Date of Patent: Jul. 11, 2017

(54) MINIMIZING LOSSES ASSOCIATED WITH STACKED SWITCH DEVICES

(71) Applicant: Infineon Technologies AG, Neubiberg (DE)

(72) Inventors: Wolfgang Granig, Villach (AT); Rolf Weis, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/091,384

(22) Filed: Apr. 5, 2016

(51) Int. Cl.
*H03K 17/687* (2006.01)
*H03K 17/10* (2006.01)

(52) U.S. Cl.
CPC .................................. *H03K 17/102* (2013.01)

(58) Field of Classification Search
CPC ............. C12Q 1/6874; H03F 2200/387; H03F 2200/451; H03F 1/56
See application file for complete search history.

(56) References Cited

U.S. PATENT DOCUMENTS 9,484,973 B1* 11/2016 Carroll ..................... H04B 1/28
2014/0062544 A1 3/2014 Weis et al.
2014/0062585 A1 3/2014 Weis \* cited by examiner

*Primary Examiner* — Sibin Chen
(74) *Attorney, Agent, or Firm* — Shumaker & Sieffert, P.A.

(57) ABSTRACT

A semiconductor device is described that includes a transistor chain which is configured as a stacked switch device that switches on and off in response to a drive voltage. The transistor chain includes a first transistor connected in series to a plurality of second transistors. Each transistor in the transistor chain is located at a particular position in the transistor chain according to at least one of a respective capacitance of the transistor and a respective threshold voltage of the transistor.

16 Claims, 12 Drawing Sheets

US 9,705,486 B1

MINIMIZING LOSSES ASSOCIATED WITH STACKED SWITCH DEVICES

TECHNICAL FIELD

The following disclosure relates to power switches.

BACKGROUND

In some power applications or systems, a stacked device configuration is used to form a low-power switching device that can withstand very high-voltages. For example, a low power (e.g., one watt to thirty watt) power adapter or charger may rely on two or more transistor devices and voltage limiting Zener diodes that are configured in a stack act as a single switch device that is used to control the flow of a current. Individually, each transistor device in the stack may only be rated to withstand approximately twenty volts. However, by stacking the transistor devices, the grouping of transistor devices can function as a single switch device that can withstand typical, AC line voltages (e.g., upwards of one hundred twenty to four hundred volts).

Despite their advantages, some stacked device configurations suffer from undesirable power-losses which can occur during the turn-off or passive $V_{DS}$ transitions of each transistor device in the stack. During an increase of $V_{DS}$ across each individual transistor device in the stack, the $C_{DS}$ charging current associated with that device flows across a respective voltage limiting Zener diode, resulting in a loss.

SUMMARY

In general, circuits and techniques are described for minimizing switching-losses associated with a stack configuration switch device. So as to minimize switching losses associated with an example stack configuration, each transistor in a transistor chain of the example stack configuration is located at a particular position in the transistor chain according to at least one of a respective capacitance of the transistor and a respective threshold voltage $V_{TH}$ of the transistor.

In one example, the disclosure is directed to semiconductor device comprising: a transistor chain that includes a first transistor connected in series to a plurality of second transistors, the transistor chain being configured as a stacked switch device that switches on and off in response to a drive voltage, wherein each transistor in the transistor chain is located at a particular position in the transistor chain according to at least one of a respective capacitance of the transistor and a respective threshold voltage of the transistor.

In another example, the disclosure is directed to a system comprising: a source; a load; a stacked switch device; and a controller configured to output a drive voltage that causes the stacked switch device to switch on and off so as to control an electrical current flowing between the source and the load, wherein: the stacked switch device includes a transistor chain comprising a first transistor connected in series to a plurality of second transistors; and each transistor in the transistor chain is located at a particular position in the transistor chain according to at least one of a respective capacitance of the transistor and a respective threshold voltage of the transistor.

In another example, the disclosure is directed to a power circuit comprising: an arrangement of switches that include a first switch connected in series to a plurality of second switches, wherein each switch in the arrangement of switches is located at a particular position in the arrangement according to at least one of a respective capacitance of the switch and a respective threshold voltage of the switch.

The details of one or more examples are set forth in the accompanying drawings and the description below. Other features, objects, and advantages of the disclosure will be apparent from the description and drawings, and from the claims.

DETAILED DESCRIPTION

In general, circuits and techniques are described for minimizing switching-losses associated with a stack configuration switch device. An example system may include multiple low-power transistor devices that make up a transistor chain or arrangement which is configured to act as a single high-voltage switch device. For example, the example power system may be part of an AC-DC power converter (e.g., for charging or powering a device from wall-power). The stack configuration may enable the switch device to be controlled via a low-voltage gate control signal, while also withstanding the high AC line voltage.

As is described below in greater detail, so as to minimize switching losses associated with the stack configuration, each transistor in transistor chain of the example system is located at a particular position in transistor chain according to at least one of a respective capacitance of the transistor and a respective threshold voltage $V_{TH}$ of the transistor. By selecting transistors according to their respective capacitance value and respective threshold voltage $V_{TH}$ value, and distributing the transistors within the transistor chain in a particular way, the example system may experience far less switching losses than other stack configurations.

Figure 1:
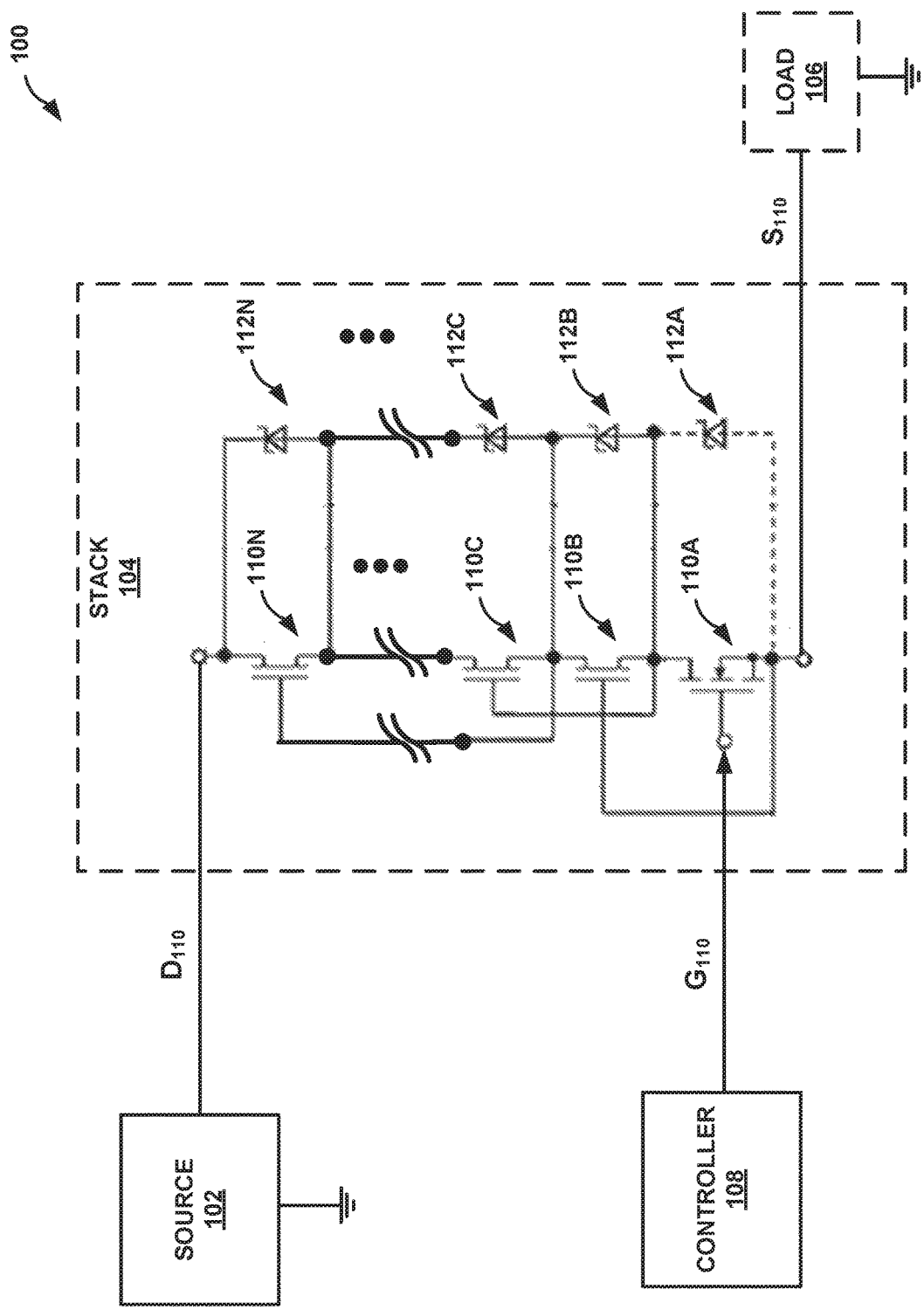
FIG. 1 is a conceptual diagram illustrating an example system that relies on an example stack configuration switch device, in accordance with one or more aspects of the present disclosure.

FIG. 1 is a conceptual diagram illustrating system 100 as an example system that relies on an example stack configuration switch device, in accordance with one or more aspects of the present disclosure. System 100 includes source 102, optional load 106, controller 108, and stacked switch device 104 (referred to simply as "stack 104"). In some examples, part or all of system 100 is implemented in a semiconductor device. In some examples, part or all of system 100 is implemented in a power circuit or any other type of electrical device. For example, portions of system 100 may be implemented in a power connector, a power converter or power adapter, and the like.

Source 102 provides or receives, via link $D_{110}$, electrical energy in the form of power to or from system 100. Numerous examples of source 102 exist and may include, but are not limited to, AC/DC converters, power grids, generators, power transformers, batteries, solar panels, windmills, degenerative braking systems, hydro electrical generators, or any other form of electrical power devices capable of providing electrical power to system 100. In some examples, source 102 may be configured as or include a load, such as load 106 as described below.

Load 106 is an optional component of system 100. When coupled to link $S_{110}$ and ground (as shown in FIG. 1) load 106 may receive, via link via link $S_{110}$, the electrical signal (e.g., voltage or current) provided by source 102 via stack 104. However in cases where load 106 is not coupled to link $S_{110}$ and ground (e.g. as power-factor-correction or "Boost" in an ACDC circuit) $S_{110}$ may be coupled directly to ground and source 102 may include load 106 in addition to other circuitry. For ease of description, system 100 is generally described below as if load 106 is coupled to ground and link $S_{110}$, however the following techniques and circuits are equally applicable to either case (e.g., when load 106 is included as part of source 102 or alternatively, when load 106 is coupled to link $S_{110}$ and ground). Numerous examples of load 106 exist and may include, but are not limited to, computing devices and related components, such as microprocessors, electrical components, circuits, laptop computers, desktop computers, tablet computers, mobile phones, batteries, speakers, lighting units, automotive/marine/aerospace/railway related components, motors, transformers, or any other type of electrical device and/or circuitry that receives a voltage or a current from a power converter.

Controller 108 may generally control the components of system 100 to control the flow of current between source 102 and load 106. Controller 108 is configured to output a drive voltage signal or "gate signal" to stack 104 to causes stack 104 to switch-open (off) or switch-closed (on). Controller 108 may comprise any suitable arrangement of hardware, software, firmware, or any combination thereof, to perform the techniques attributed to controller 108 that are described herein. Controller 108 may be coupled to stack 104 via link $G_{110}$ to send a drive voltage signal to stack 104 for controlling the flow of current between source 102 and load 106.

Controller 108 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller 108 includes software or firmware, controller 108 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

Stack 104 refers to a semiconductor device that is configured to switch on and off in response to a drive voltage received via link $G_{110}$. When stack 104 is switched on (e.g., closed), a short or load-path is created between link $D_{110}$ and link $S_{110}$ so that electrical current can move between source 102 and load 106. When stack 104 is switched off (e.g., opened), the short or load-path that would otherwise be created between link $D_{110}$ and link $S_{110}$ is opened so that electrical current cannot move between source 102 and load 106.

Stack 104 includes transistor chain 110 that includes a first transistor 110A connected in series to a plurality of second transistors 110B-110N. Transistor chain 110 may also be referred to as an arrangement of switches that include a first switch 110A connected in series to a plurality of second switches 110B-110N. Transistor chain 110 is configured to operate as a single stacked switch device that switches on and off in response to a drive voltage at link $G_{110}$ (which is coupled to a gate terminal of first transistor 110A).

In some examples, stack 104 further includes a respective diode 112A-110N (e.g., a Zener diode) arranged in parallel to the respective load path of each transistor 110A-110N in transistor chain 110. In the example of FIG. 1, transistor 110A is a normally-off transistor. In some examples, transistors 110A-110N are Gallium Nitride (GaN) transistor devices.

Each transistor in transistor chain 110 includes at least a respective control terminal (also referred to as a "gate terminal"), respective first and second load terminals (also referred to as "source and drain terminals), and a respective load path between the respective first and second load terminals. When a voltage level at the respective control terminal of each transistor in transistor chain 110 is at a sufficient voltage level, the respective load path of that transistor will conduct a current between the respective load terminals of that transistor. When the voltage level at the respective control terminal of each transistor in transistor chain 110 is at a less than sufficient voltage level, the respective load path of that transistor will not conduct the current between the respective load terminals of that transistor.

As shown in FIG. 1, the respective load path of each of the second transistors 110B-110N is connected in series to the respective load path of first transistor 110A. The respective control terminal of all but one of second transistors 110B-110N is connected to the respective second load terminal of another of second transistors 110B-110N. And the respective control terminal of the one of second transistors 110B-110N that is not connected to the respective second load terminal of another of second transistors 110B-110N is connected to the respective second load terminal of first transistor 110A, which in the example shown in FIG. 1 is also coupled to link $S_{110}$. Put another way, the respective gate terminal of each of second transistors 110C-110N is connected to the respective source of the second transistors 110B-110N−1. And the respective gate terminal of second transistor 110B is connected to the respective source terminal of first transistor 110A at link $S_{110}$.

As is described below in greater detail, in accordance with techniques of this disclosure, each transistor 110A-110N in transistor chain 110 is located at a particular position in transistor chain 110 according to at least one of a respective capacitance of the transistor 110A-110N and a respective threshold voltage $V_{TH}$ of the transistor 110A-110N. By distributing the capacitances and/or threshold voltages within transistor chain 110 in a particular way, system 100 and stack 104 may experience far less switching losses than other stack configurations For example, consider the electrical waveform diagram of FIG. 2A which illustrates example electrical characteristics of other stack configuration switch devices. Other stacked device configurations are not typically designed to minimize switching-losses that may occur during the turn-off or passive $V_{DS}$ transitions of each transistor device in the stack. That is, during an increase of $V_{DS}$ across each individual transistor device in the stack, the capacitive charging current $C_{DS}$ associated with that device flows across a respective voltage limiting Zener diode, resulting in an individual loss associated with that transistor. For example, such a loss can be seen in FIG. 2A, where after the gate voltage drops at approximately time 2, the output capacitances Coss of the three lowest transistors in the stack produce charging currents Zener I1-I3 at the respective Zener diodes between times 2.5 and 3.5. The sum of the individual losses associated with all the transistors in the stack results in a significant overall switching loss attributed to the stacked configuration switch device.

Despite these switching-losses, other stack configuration switch device arrangements are not designed to minimize switching-losses. Instead, typically, only the conduction-loss of the other stacks is minimized. One way to minimize conduction loss is by universally changing the depletion threshold voltage $V_{TH}$ of each transistor in the chain to more negative values to achieve a uniformly more negative threshold voltage VTH and a uniformly lower overall on-resistance $R_{DSon}$ of the overall stacked configuration switch device. In other words, each transistor in the chain is made to have the same, more negative threshold voltage $V_{TH}$ and therefore lower $R_{DSon}$.

Figure 2:
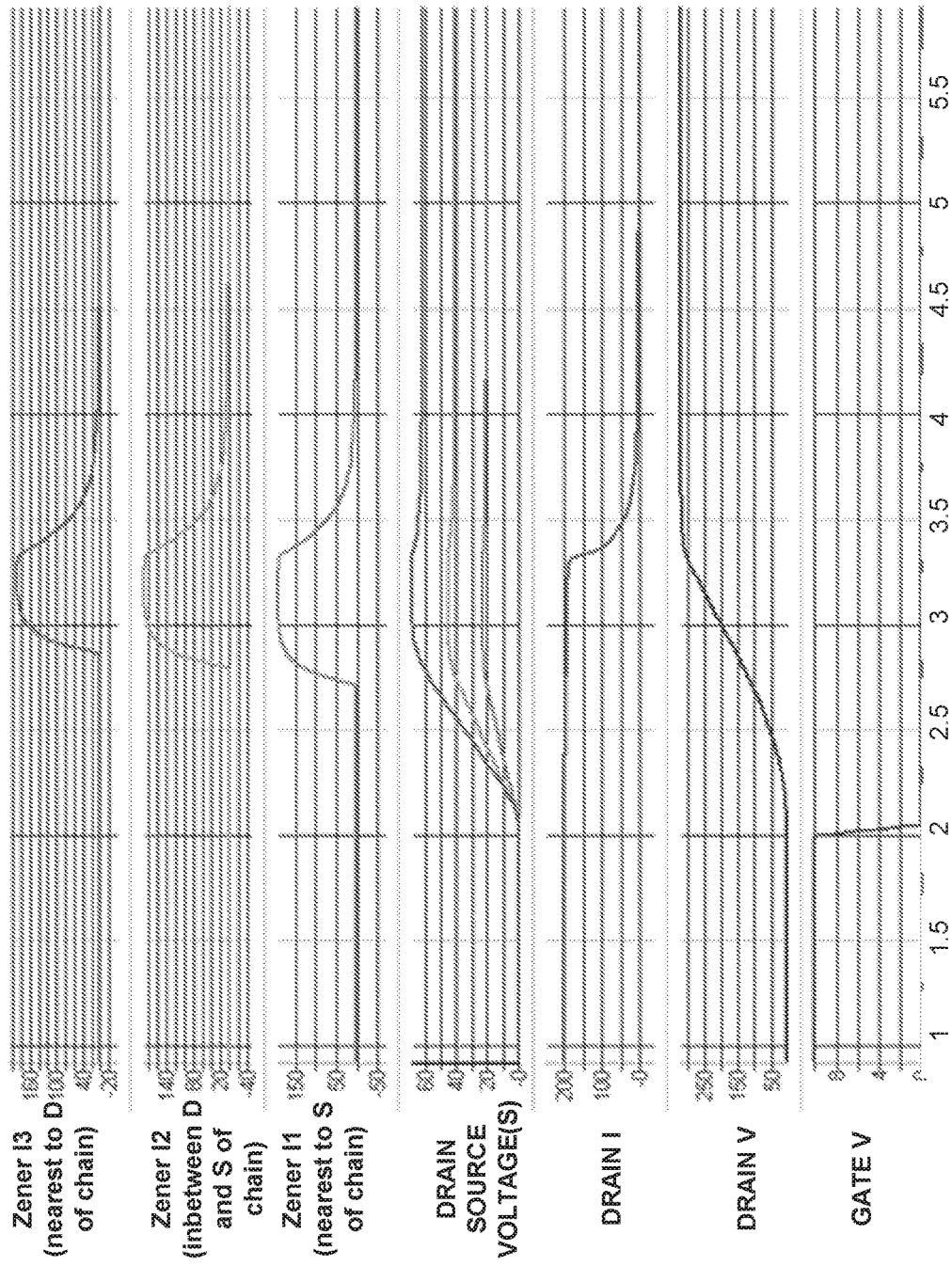
FIG. 2 is an electrical waveform diagrams illustrating example electrical characteristics of other stack configuration switch devices.
Figure 3:
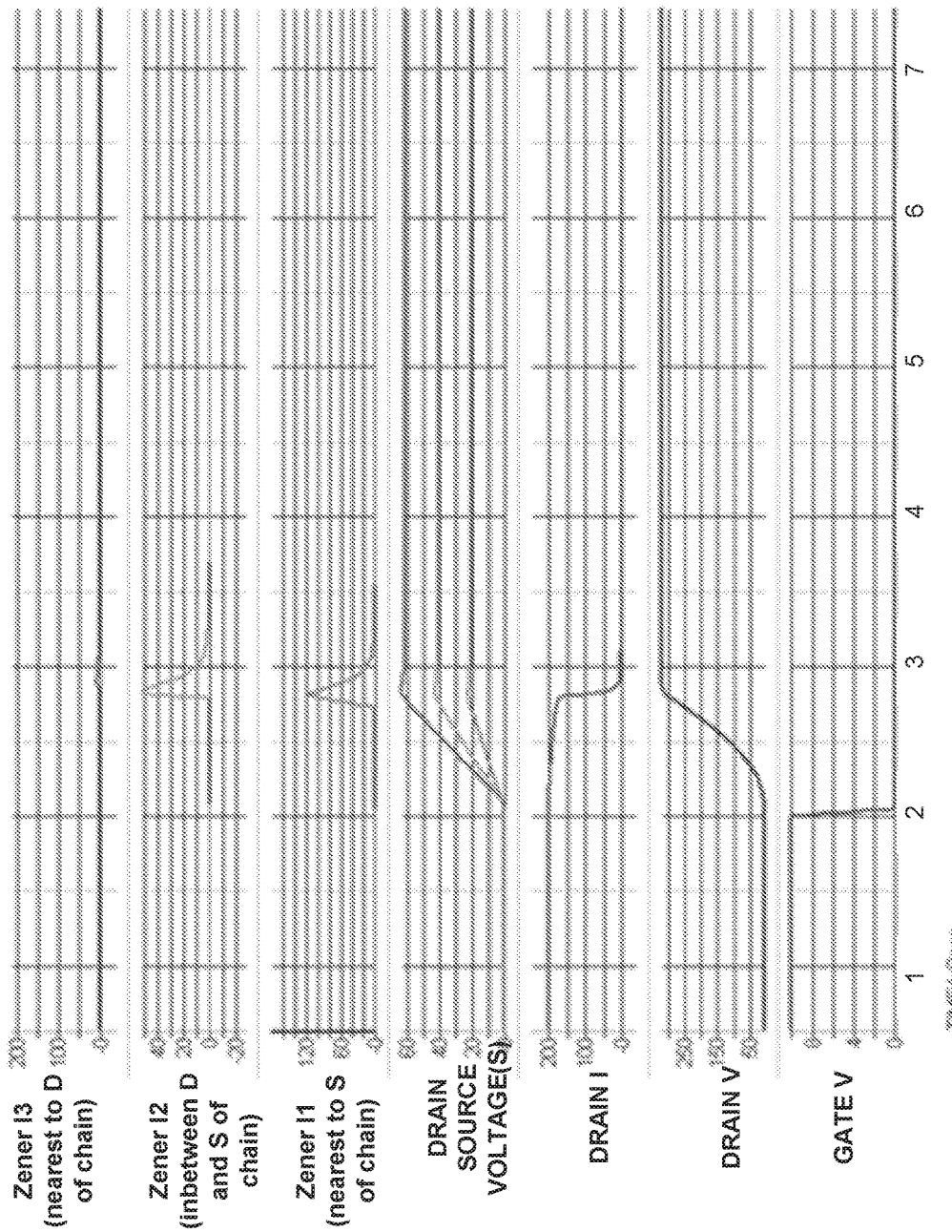
FIG. 3 is an electrical waveform diagrams illustrating example electrical characteristics of other stack configuration switch devices.

FIG. 3 illustrates example electrical characteristics of other stack configuration switch devices in which the threshold voltage $V_{TH}$ has been made a more positive value for each individual transistor device in the stack. As shown by currents Zener I1-I3 in FIG. 3, because the threshold voltage $V_{TH}$ has been made a more positive (i.e. less negative) value for each individual transistor device in the stack, the stack is switching faster and only the two lowest Zener diodes are still conducting during turn-off (e.g., reached at time 3). Because these two Zener diodes are conducting for a shorter duration which illustrates that as compared to the losses shown in FIG. 2, the switching losses of a stacked switch configuration with transistor devices that have reduced threshold voltages (i.e. more positive) $V_{TH}$ are significantly reduced.

Figure 4:
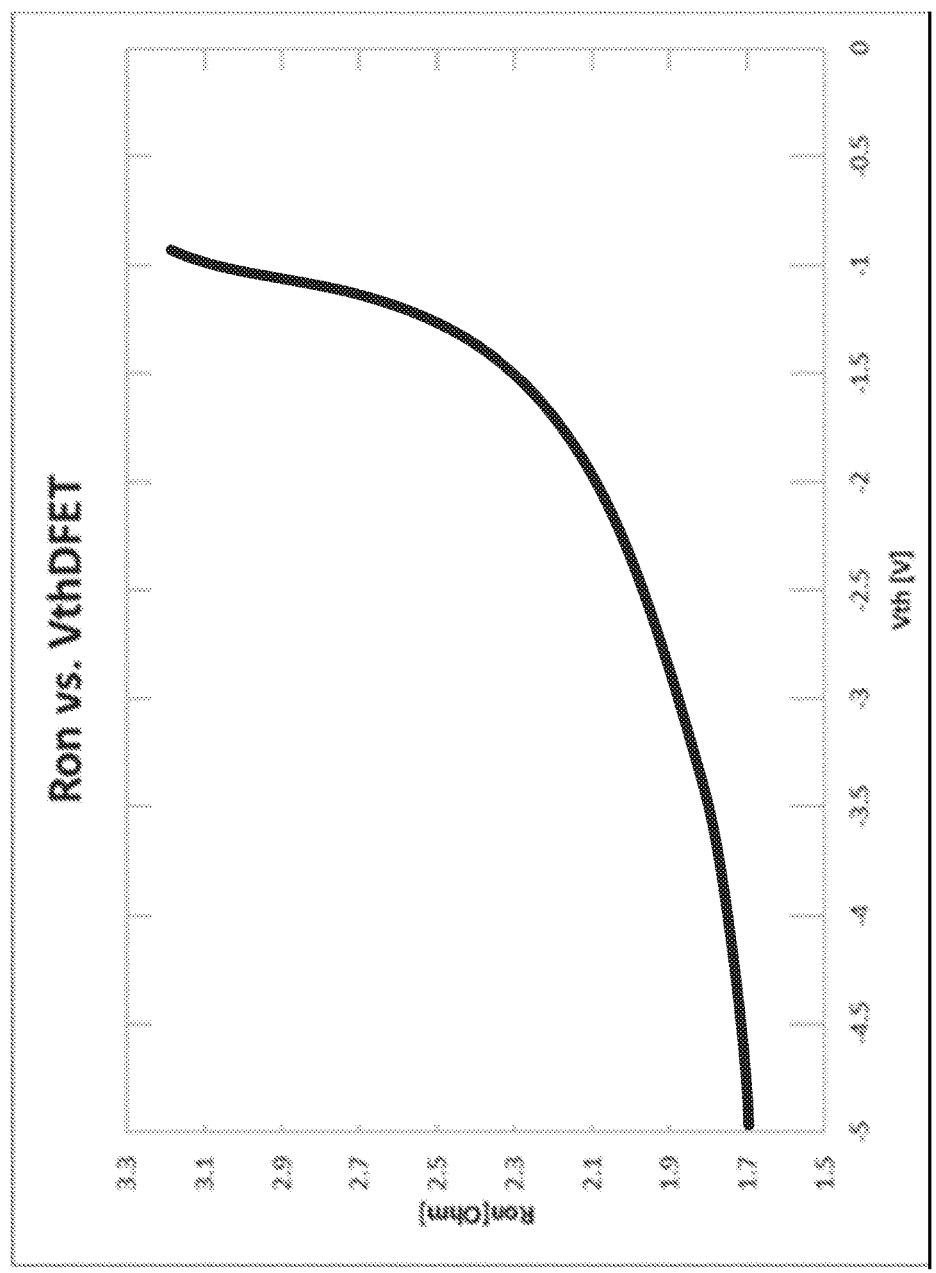
FIG. 4 is an electrical waveform diagram illustrating a relationship between on-resistance ($R_{DSon}$) and the depletion region voltage threshold Vth of a transistor device.
Figure 5:
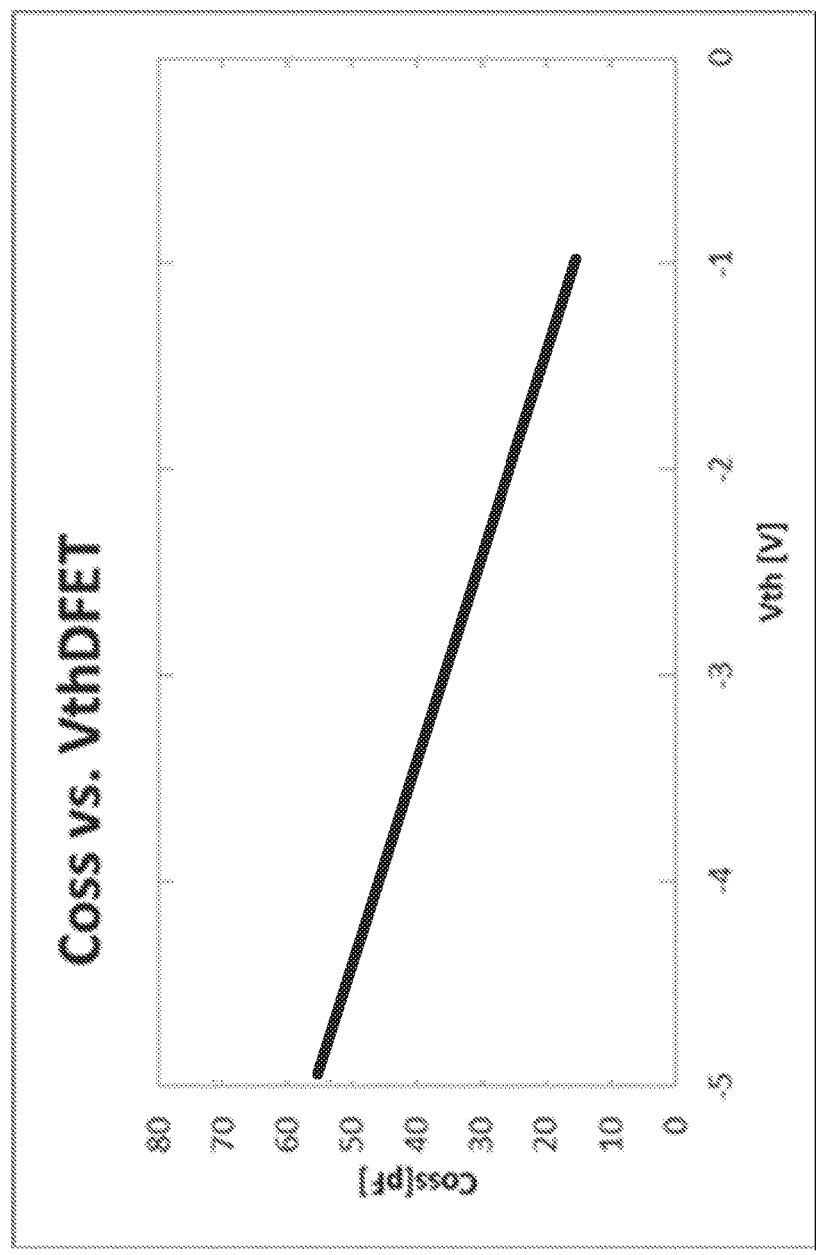
FIG. 5 is an electrical waveform diagram illustrating a relationship between output capacitance Coss and the depletion region voltage threshold Vth of a transistor device.

FIG. 4 is an electrical waveform diagram illustrating the relationship between on-resistance $R_{DSon}$ of a transistor and the depletion region voltage threshold $V_{TH}$ of the transistor. FIG. 5 is an electrical waveform diagram illustrating the relationship between output capacitance Coss of a transistor and the depletion region voltage threshold $V_{TH}$ of the transistor. FIGS. 4 and 5 illustrate how, despite potentially minimizing conduction losses by improving the $R_{DSon}$ of the individual devices in the transistor chain, the threshold voltage $V_{TH}$ of the individual devices also becomes more negative across all devices and therefore the transistor chain can dramatically increase the switching-losses. Such switching losses may occur (e.g., as can be seen in FIG. 2 compared to FIG. 3) when the individual devices 110 in the transistor chain 104, especially those close to source 102, are charged early to the maximum voltage limited by Zener diodes 112 as compared to the time required for the whole transistor chain 104 to reach the applied voltage. Then each individual device 110 may be blocking early, and charge required to completely switch-off upper devices 110 has to be transported over the Zener diodes 112 while in parallel passing the blocking device 110 at maximum voltage limited by the Zener diode 112. This Zener diode 112 current is causing losses. This is because, as shown in FIGS. 4 and 5, when the voltage threshold $V_{TH}$ is more negative, the transistors capacitance $C_{DS}$ must be charged with more charge and energy so that the next power-switch in the chain gets turned-off later. In total the whole chain is seen from the circuit around with higher output capacitance Coss and energy stored therein Eoss, which cannot be recovered because of currents flowing via Zener diodes for charging.

To prevent high switching-losses, a charging-current across the Zener diodes of a stack configuration switching device is to be avoided. An example stack configuration switching device, in accordance with the techniques of this disclosure, may prevent a charging-current across its Zener diodes via a proper dimensioning of the following design-parameters: the active area of the semiconductor device, the voltage threshold $V_{TH}$ of the transistors in the device, and the input capacitance Ciss and output capacitance Coss of each transistor.

With respect to FIG. 1, the active area of each transistor 110 of stack 104 define the on resistance Ron of transistor chain 110, the output capacitance Coss of transistor chain 110, and the passive energy loss E of transistor chain 110. The larger the active area for each transistor in chain 110, the lower the overall on resistance Ron of chain 110, the higher the overall output capacitance Coss of chain 110, and the larger the passive energy loss E of chain 110.

The $V_{TH}$ of each transistor 110 of stack 104 define the on resistance Ron of transistor chain 110 and the output capacitance Coss of transistor chain 110. The more negative the threshold voltage $V_{TH}$ of each transistor 110, the lower the on resistance Ron, the larger the overall output capacitance Coss of transistor chain 110, and the larger the overall passive energy loss E of transistor chain 110.

The input capacitance Ciss and the output capacitance Coss of each transistor 110 of stack 104 define the overall output capacitance of transistor chain 110. The larger the output capacitance Coss of each transistor 110 and/or the larger the input capacitance Ciss of each transistor 110, the higher overall output capacitance Coss of transistor chain 110, the higher overall input capacitance Ciss of transistor chain 110, and the higher overall passive energy loss E of transistor chain 110.

Accordingly, the relationship in the design parameters of a stack configuration switch device make evident that a tradeoff exists between minimizing overall conduction-losses and minimizing overall switching-losses. For lower overall conduction-losses, the transistors in the transistor chain should have more negative threshold voltages $V_{TH}$ and an increase in size of the active area. Conversely, for lower overall switching-losses, the transistors in the transistor chain should have properties that minimize the output and input capacitances Coss and Ciss of the transistors in the transistor chain, minimize the overall size of the active area, and have less negative threshold voltages $V_{TH}$.

If zero-voltage-switching output capacitance Coss is of minor importance for an application of stack 104, then only the on resistance Ron and passive energy loss parameters of stack 104 remain. The on resistance Ron is to be selected to avoid passive energy loss E and the passive energy loss E is to be reduced to avoid currents across the Zener diodes 112. By designing stack 104 so as to precisely control the stacked voltage $V_{DS}$ during turn-off or the stacked voltage $V_{DS}$ step, stack 104 can be designed so that a non-zero, voltage never appears across Zener diodes 112.

For example, by making the threshold voltage $V_{TH}$ of each transistor 110 in chain 110 less negative (e.g., close to zero volts), the capacitances $C_{DS}$ of each transistor 110 in the chain 110 charge synchronously and which results in each transistor having the same voltage $V_{DS}$. If enough transistor devices 110 are used in chain 110, stack 104 may never have a non-zero voltage across Zener diodes 112 and therefore may never have switching or passive energy losses. However, less negative threshold voltages $V_{TH}$ lead to poor conduction performance (e.g., increasing conduction losses). That is, transistors 110 may not turn-on fully in the on-state which may result in high conduction losses. Therefore, the threshold voltage $V_{TH}$ of transistors 110 of stack 104 should be at more negative values to avoid conduction losses.

In accordance with techniques of this disclosure, a stack configuration switch device may compensate for switching losses that may be induced by having transistors with more negative threshold voltages $V_{TH}$, through scaling of the output capacitances Coss of each transistor in the chain. Through adaption of stacked certain transistor device parameters, an example stack, such as stack 104, may avoid Zener diode conduction and therefore avoid switching-losses and passive energy losses.

For example, one way to scale the capacitances $C_{DS}$ may be to position the transistor with the largest capacitance $C_{DS}$ at the lowest position in the chain with each upper transistor having a consecutively lower $C_{DS}$ values. For example, with respect to FIG. 1, the first transistor 110A in the chain 110 may be located at an initial position in the transistor chain 110 and may have a greater respective capacitance $C_{DS}$ than any other transistor 110B-110N in the transistor chain 110. The second transistors 110B-110N may be distributed at subsequent positions in the transistor chain 110 in order from greatest respective capacitance $C_{DS}$ to lowest respective capacitance $C_{DS}$.

In some examples, as the capacitances $C_{DS}$ of the transistors 110 in the transistor chain 110 are scaled to avoid switching losses, no two transistors 110 in the transistor chain 110 have equivalent respective capacitances $C_{DS}$. For example, the respective capacitances $C_{DS}$ of the transistors 110 in the transistor chain 110 decrease linearly along the transistor chain 110. In some examples, the respective capacitances $C_{DS}$ of the transistors 110 in the transistor chain 110 decrease logarithmically along the transistor chain 110 so that transistor 110N has a smallest respective capacitance $C_{DS}$ than any other transistor 110 in the chain 110.

A second way to minimize switching losses without necessarily increasing conduction losses in a stack configuration switch device, such as stack 104, may be to individually scale the threshold $V_{TH}$ of each transistor in the stack to avoid voltages $V_{DS}$ at each transistor during switching that would induce Zener diode conduction and reduce losses. In other words, one way to scale the threshold $V_{TH}$ may be to position the transistor with the least negative threshold $V_{TH}$ at the lowest position in the chain with each upper transistor having a consecutively more negative threshold $V_{TH}$ value.

For example, with respect to FIG. 1, the first transistor 110A may be located at an initial position in the transistor chain 110 and may have a less negative respective threshold voltage $V_{TH}$ than any other transistor 110B-110N in the transistor chain 110. The second transistors 110B-110N may be distributed at subsequent positions in the transistor chain 110 in order from least negative respective threshold voltage $V_{TH}$ to most negative respective threshold voltage $V_{TH}$.

In some examples, no two transistors 110 in the transistor chain 110 may have equivalent respective threshold voltages $V_{TH}$. For example, wherein values of the respective threshold voltages $V_{TH}$ of the transistors 110 in the transistor chain 110 may decrease linearly (becoming more negative) along the transistor chain 110. In some examples, values of the respective threshold voltages $V_{TH}$ of the transistors 110 in the transistor chain 110 may decrease logarithmically (becoming more negative) along the transistor chain so that transistor 110N has a more negative threshold voltage $V_{TH}$ than any other transistor 110 in the chain 110.

Figure 6:
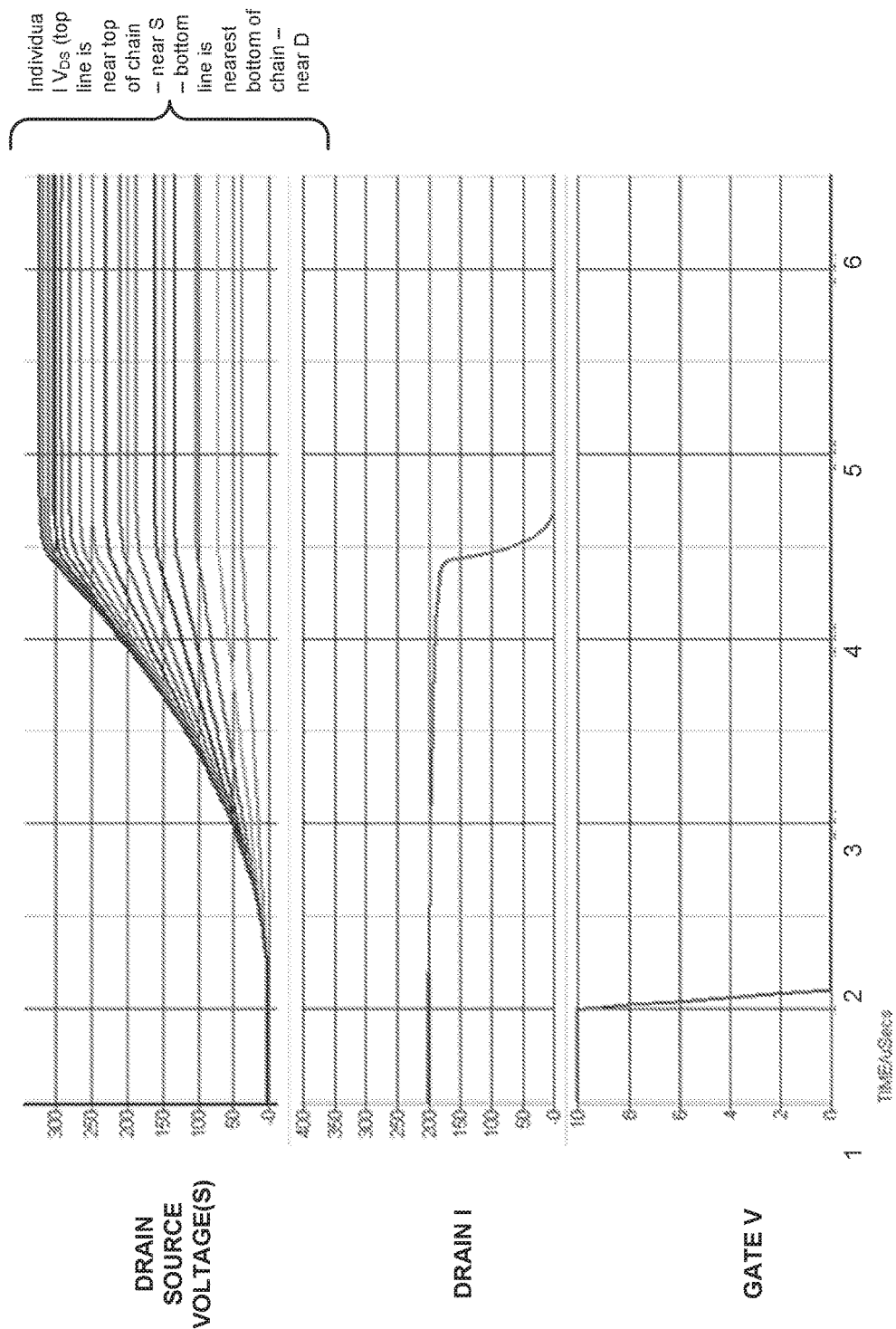
FIG. 6 is an electrical waveform diagram illustrating further example electrical characteristics of a stack configuration switch device without any Zener diodes.

To illustrate how scaling the respective capacitances $C_{DS}$ and/or respective threshold voltages $V_{TH}$ of each of the transistors 110 in chain 104 can minimize switching losses without unduly increasing conduction losses, turn to FIG. 6. FIG. 6 is an electrical waveform diagram illustrating further example electrical characteristics of a stack configuration switch device without any Zener diodes. In other words, FIG. 6 shows drain-source voltage $V_{DS}$ distribution of transistors 110 of stack 104 if parallel Zener diodes 112 were removed. As shown in FIG. 6, the voltages $V_{DS}$ across transistors 110 are a non-uniform distribution and none of the transistor chain voltages $V_{DS}$ is reaching a value larger than the voltage, which would be otherwise limited by a Zener diode when the transistor chain reaches the applied overall voltage. Therefore, by scaling the capacitances $C_{DS}$ and/or threshold voltages $V_{TH}$ in the inverse from of this voltage distribution, the voltages $V_{DS}$ can be made the same at each of transistors 110.

Figure 7:
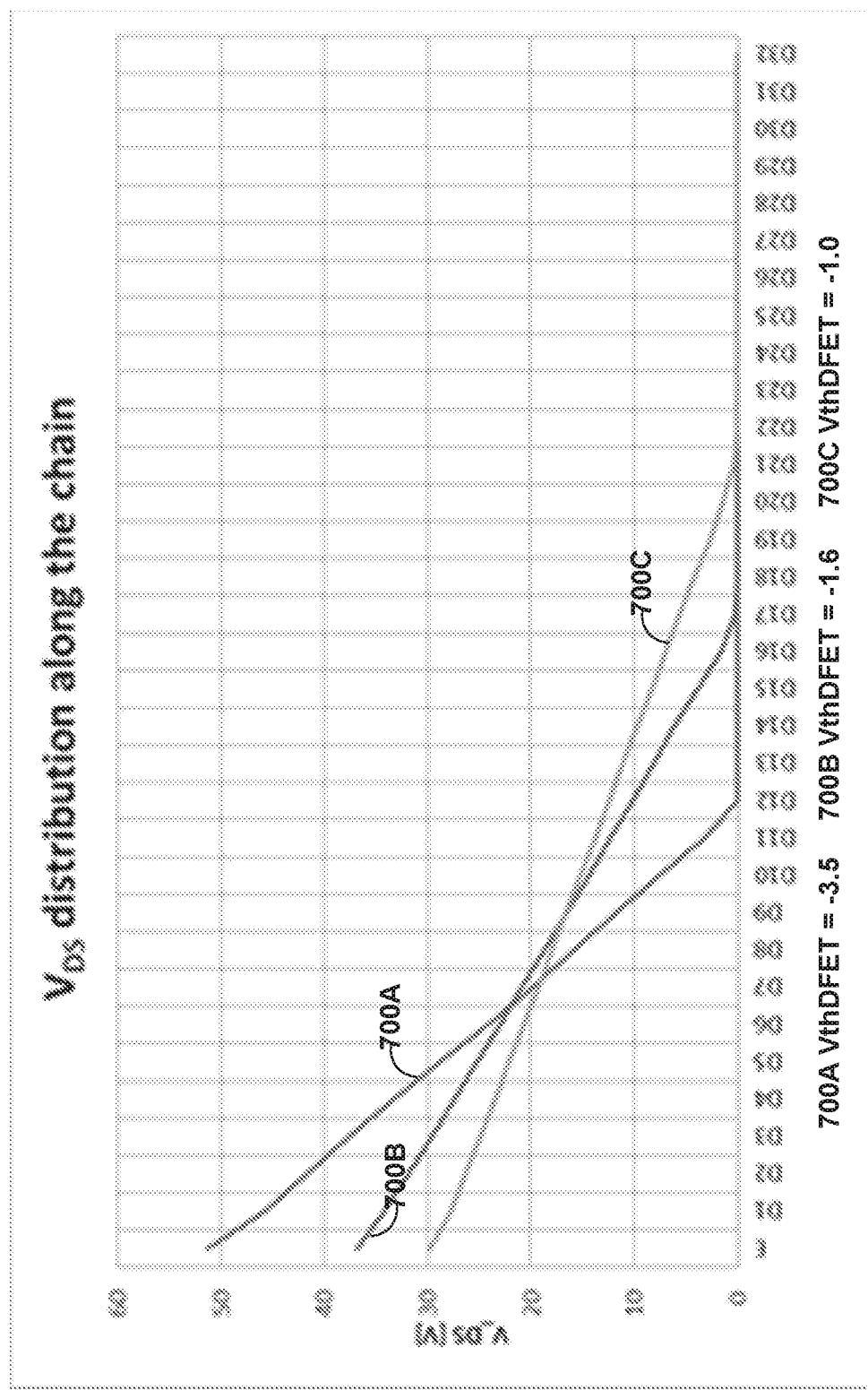
FIG. 7 is an electrical waveform diagram illustrating drain-source voltage $V_{DS}$ characteristics of the example stack configuration switch device in the example system of FIG. 1.

For example, FIG. 7 is an electrical waveform diagram illustrating drain-source voltage $V_{DS}$ characteristics of the example stack configuration switch device in the example system of FIG. 1. In FIG. 7, there are three different $V_{DS}$ distributions for three different threshold voltages $V_{TH}$. In some examples, the Zener diodes 112 may each conduct if the drain-source voltage $V_{DS}$ exceeds twenty volts, so the several (e.g., seven) lower position transistor devices 110 may need to be adapted in all the cases, independent of threshold voltage $V_{TH}$.

Figure 8:
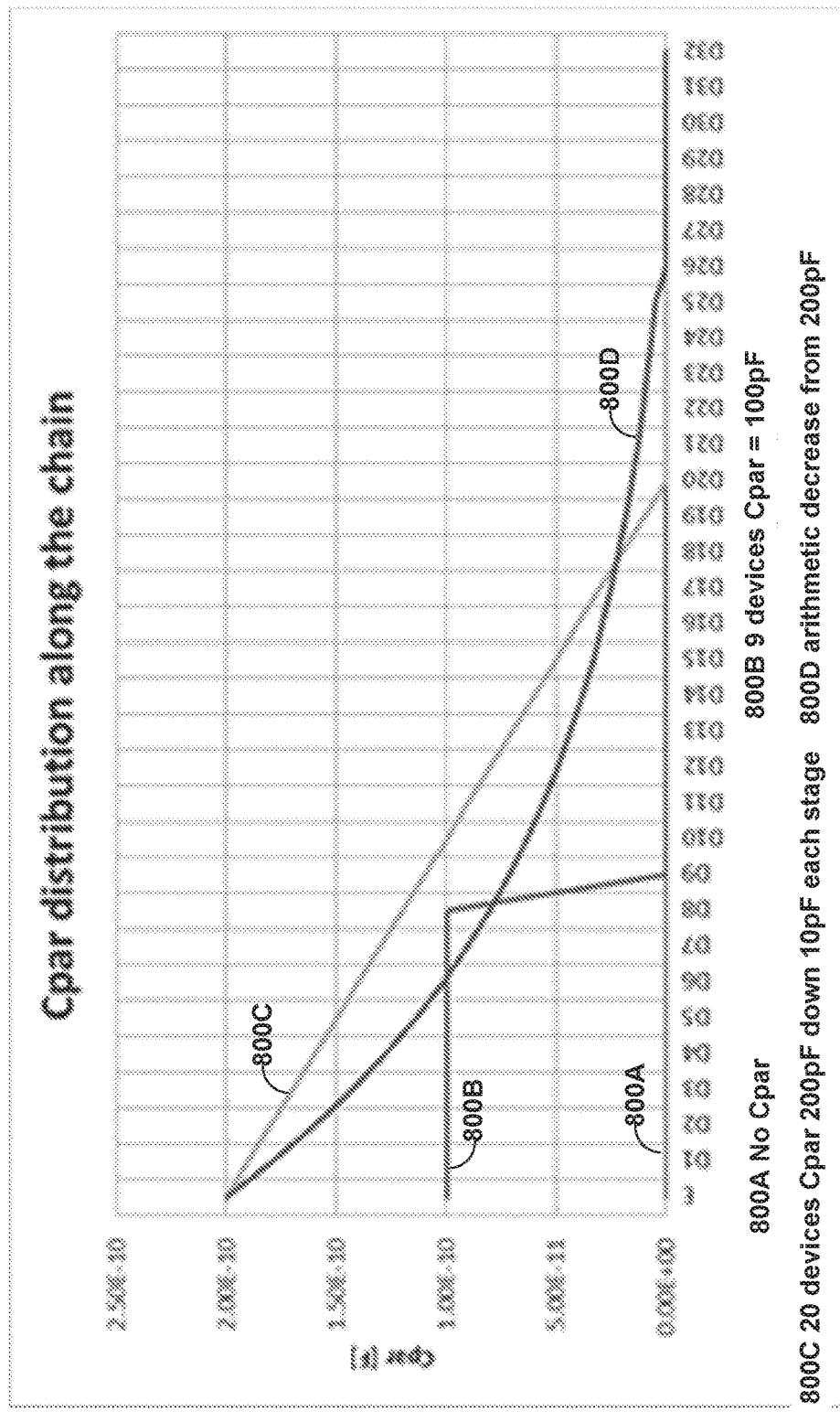
FIG. 8 is an electrical waveform diagram illustrating parasitic capacitance Cpar characteristics of the example stack configuration switch device in the example system of FIG. 1.

FIG. 8 is an electrical waveform diagram illustrating parasitic capacitance Cpar characteristics of the example stack configuration switch device in the example system of FIG. 1. In FIG. 8, there are three possible parasitic capacitance Cpar distributions. One distribution has the first nine transistors 110 at a constant parasitic capacitance Cpar with the remaining transistors 110 at no parasitic capacitance. A second distribution has the first twenty transistors 110 at a linearly decreasing parasitic capacitance Cpar while with the remaining transistors 110 at no parasitic capacitance (e.g., the first transistor 110A may have a 200 pF parasitic capacitance with each subsequent transistor 110 having a parasitic capacitance Cpar that is 10 pF less than the previous). The third distribution has transistors 110 at a logarithmically decreasing parasitic capacitance Cpar.

Figure 9:
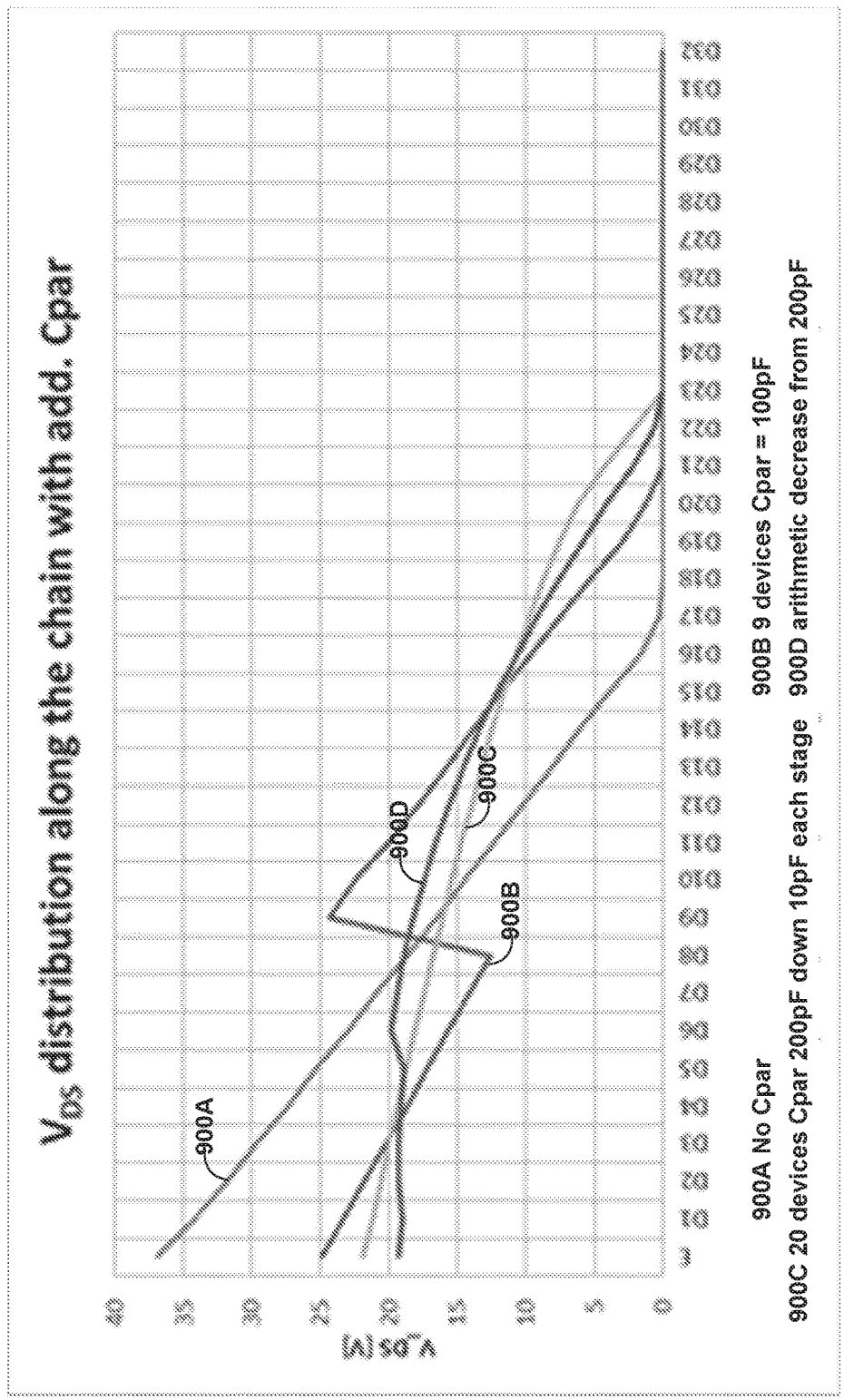
FIG. 9 is an electrical waveform diagram illustrating resulting drain-source voltage $V_{DS}$ characteristics of the example stack configuration switch device in the example system of FIG. 1 given the parasitic capacitance Cpar characteristics shown in FIG. 8.

FIG. 9 is an electrical waveform diagram illustrating resulting drain-source voltage $V_{DS}$ characteristics of the example stack configuration switch device in the example system of FIG. 1 given the parasitic capacitance Cpar characteristics shown in FIG. 8. In other words, FIG. 9 shows the $V_{DS}$ characteristics of FIG. 7 during turn-off while taking into account the parasitic capacitances of FIG. 8.

Figure 10:
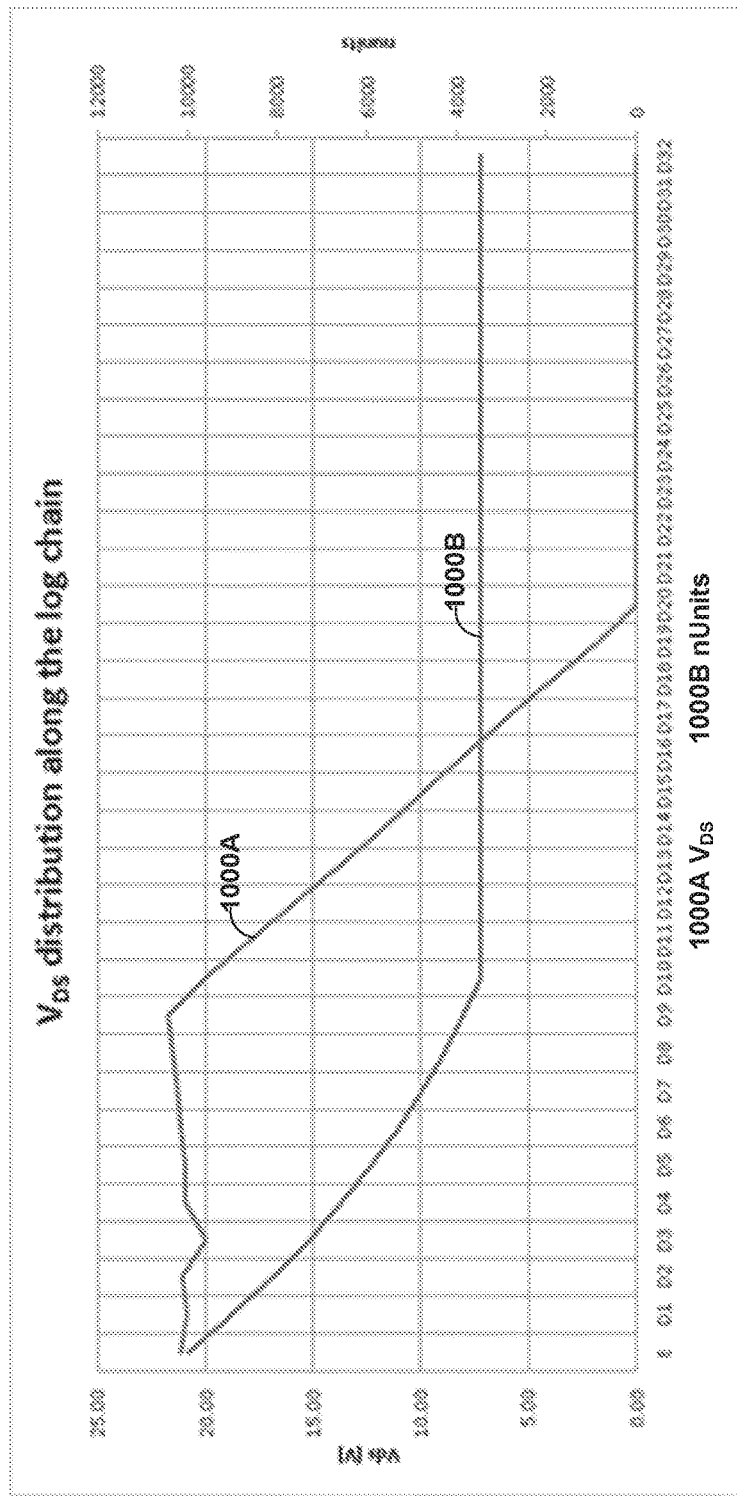
FIGS. 10 through 12 are each electrical waveform diagrams illustrating additional drain-source voltage $V_{DS}$ characteristics of the example stack configuration switch device in the example system of FIG. 1.
Figure 11:
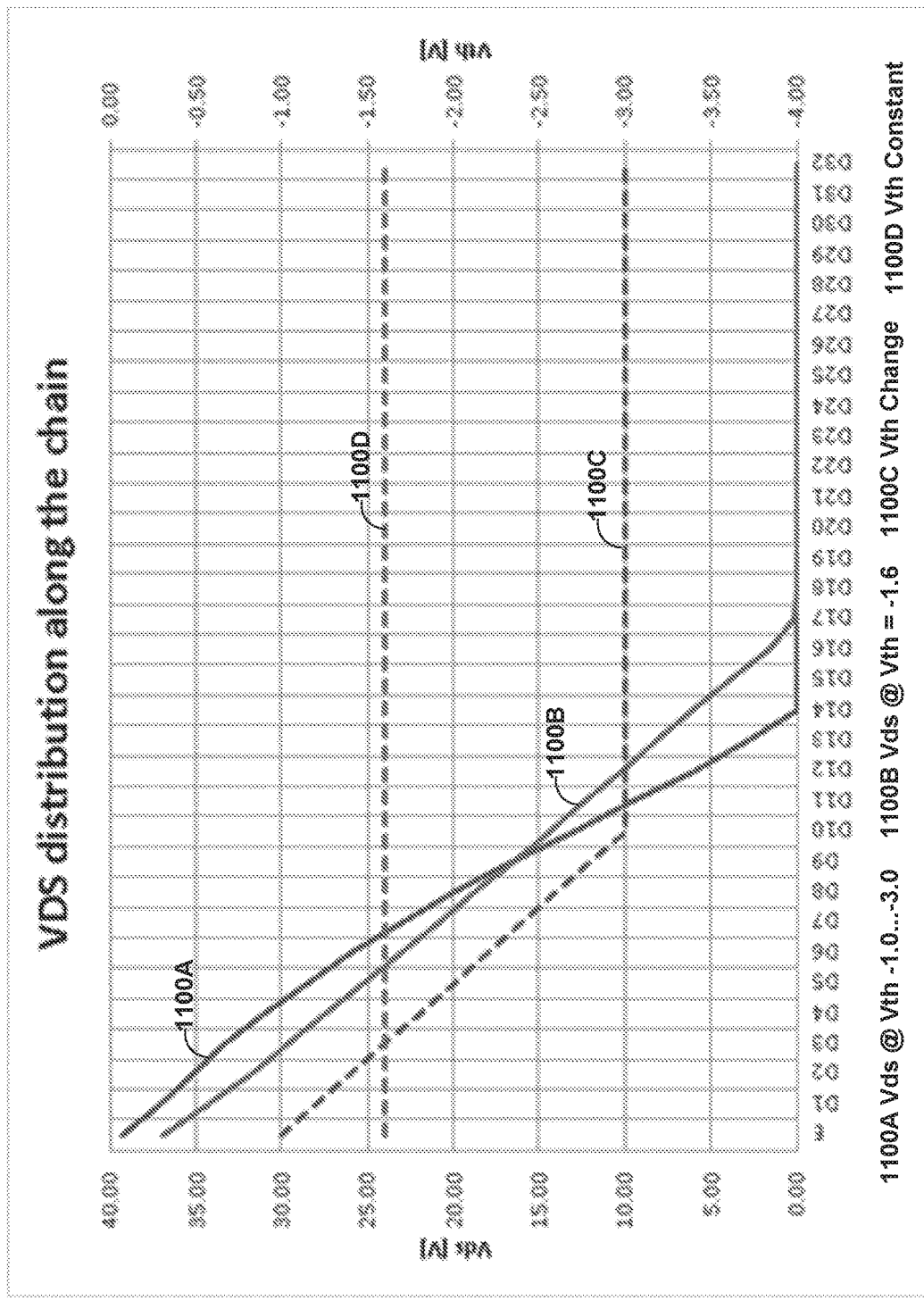
Figure 12:
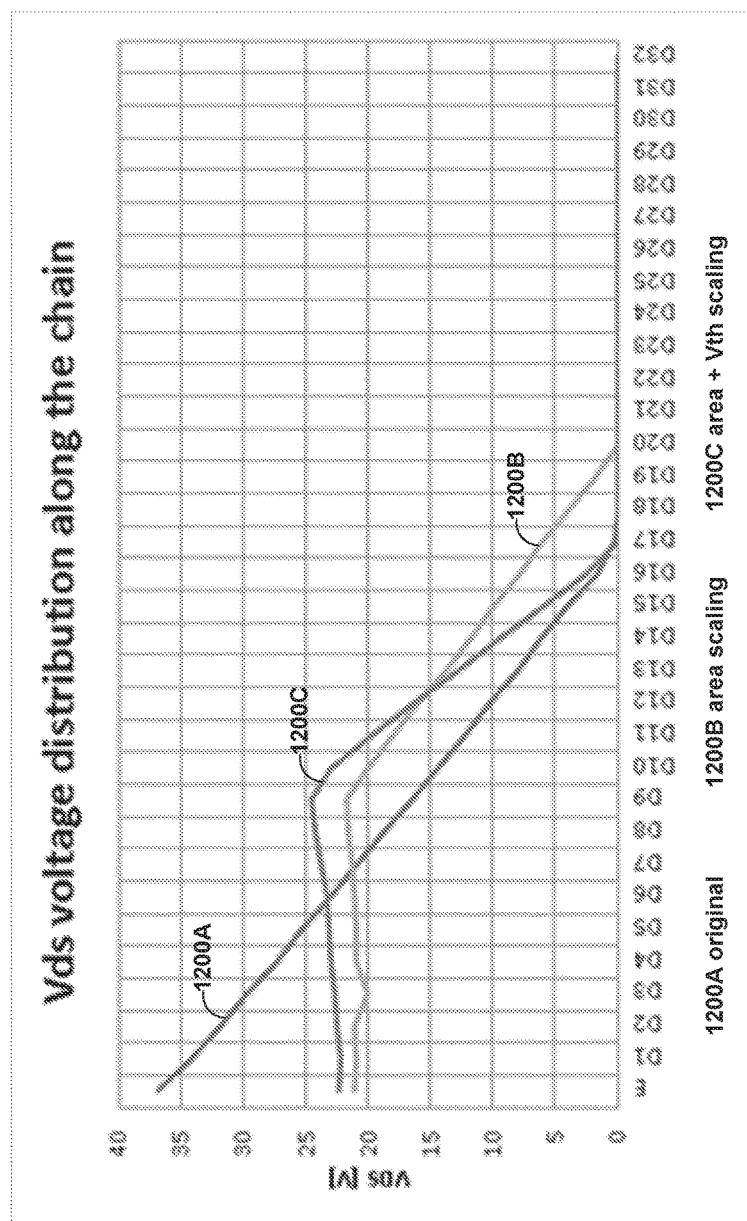

FIG. 10-12 are each electrical waveform diagrams illustrating additional drain-source voltage $V_{DS}$ characteristics of the example stack configuration switch device in the example system of FIG. 1. FIG. 10 shows drain-source voltage characteristics of transistors 110 when stack 104 is implemented using logarithmic or exponential scaling of the drain-source capacitances $C_{DS}$ of transistors 110, in accordance with techniques of this disclosure. FIG. 11 shows drain-source voltage characteristics of transistors 110 when stack 104 is implemented using logarithmic or exponential scaling of the threshold voltages $V_{TH}$ of transistors 110, in accordance with techniques of this disclosure. FIG. 12 shows drain-source voltage characteristics of transistors 110 when stack 104 is implemented using combined logarithmic or exponential scaling of the drain-source capacitances $C_{DS}$ of transistors 110 and logarithmic or exponential scaling of the threshold voltages $V_{TH}$ of transistors 110, in accordance with techniques of this disclosure.

As shown by FIG. 10, the active area of each transistor 110 can be scaled in a logarithmic or linear manner, such that the lowest transistor (e.g., transistor 110A) has the largest area and therefore has the largest capacitance $C_{DS}$. The area of the next transistor (e.g., transistor 110B) can be scaled slightly smaller, and so on. In case of logarithmic scaling, the $V_{DS}$ of each transistor will remain the same, at least for the lowest power-switches where the highest amount energy is stored (e.g., the first nine transistors as shown in FIG. 10). Capacitance $C_{DS}$ (or active area size) scaling, as evidenced by FIG. 10, may produce a $V_{DS}$ across transistor chain 110 that prevents conduction in the Zener diodes 112 during switching, and therefore, may prevent or at least minimize switching losses without inducing additional conduction losses.

FIG. 11 shows that the voltage threshold $V_{TH}$ of each transistor 110 can be scaled in a logarithmic or linear manner, such that the lowest transistor (e.g., transistor 110A) has the least negative voltage threshold $V_{TH}$. The voltage threshold $V_{TH}$ of the next transistor (e.g., transistor 110B) can be scaled slightly more negative, and so on. Voltage threshold $V_{TH}$ scaling, alone may not be as effective as area or capacitance $C_{DS}$ scaling, but voltage threshold $V_{TH}$ scaling may still help to flatten the voltage $V_{DS}$ distribution across different transistors 110.

FIG. 12 shows that voltage threshold $V_{TH}$ scaling techniques can be combined with capacitance $C_{DS}$ scaling techniques to produce a stack configuration switch device that has even fewer switching losses than a stack configuration switch device that relies on voltage threshold $V_{TH}$ scaling techniques or capacitance $C_{DS}$ scaling alone. The respective capacitance $C_{DS}$ and the respective voltage threshold VTH of each transistor 110 in the transistor chain 110 of stack 104 can be scaled in a logarithmic or linear manner. For example, the lowest transistor (e.g., transistor 110A) may have the largest area and therefore the largest capacitance $C_{DS}$ and may also have the least negative voltage threshold $V_{TH}$. For the next transistor (e.g., transistor 110B), the capacitance $C_{DS}$ can be scaled slightly smaller and the voltage threshold $V_{TH}$ can be scaled slightly more negative. Combining voltage threshold $V_{TH}$ scaling with capacitance $C_{DS}$ scaling may produce a stack configuration switch device that has fewer switching losses than a stack configuration switch device that relies either voltage threshold $V_{TH}$ scaling or capacitance $C_{DS}$ scaling alone.

Clause 1. A semiconductor device comprising: a transistor chain that includes a first transistor connected in series to a plurality of second transistors, the transistor chain being configured as a stacked switch device that switches on and off in response to a drive voltage, wherein each transistor in the transistor chain is located at a particular position in the transistor chain according to at least one of a respective capacitance of the transistor and a respective threshold voltage of the transistor.

Clause 2. The semiconductor device of clause 1, wherein: the first transistor is located at an initial position in the transistor chain and has a greater respective capacitance than any other transistor in the transistor chain; and the second transistors are distributed at subsequent positions in the transistor chain in order from greatest respective capacitance to lowest respective capacitance.

Clause 3. The semiconductor device of clause 2, wherein the respective capacitances of at least the initial three transistors in the transistor chain decrease linearly along the transistor chain, the initial three transistors including the first transistor and the next two second transistors.

Clause 4. The semiconductor device of clause 2, wherein the respective capacitances of at least the initial three transistors in the transistor chain decrease logarithmically along the transistor chain, the initial three transistors including the first transistor and the next two second transistors.

Clause 5. The semiconductor device of any combination of clauses 1-4, wherein: the first transistor is located at an initial position in the transistor chain and has a less negative respective threshold voltage than any other transistor in the transistor chain; and the second transistors are distributed at subsequent positions in the transistor chain in order from least negative respective threshold voltage to most negative respective threshold voltage.

Clause 6. The semiconductor device of clause 5, wherein values of the respective threshold voltages of at least the initial three transistors in the transistor chain decrease linearly along the transistor chain, the initial three transistors including the first transistor and the next two second transistors.

Clause 7. The semiconductor device of clause 5, wherein values of the respective threshold voltages of at least the initial three transistors in the transistor chain decrease logarithmically along the transistor chain, the initial three transistors including the first transistor and the next two second transistors.

Clause 8. The semiconductor device of any combination of clauses 1-7, wherein no two transistors in the transistor chain have equivalent respective capacitances.

Clause 9. The semiconductor device of any combination of clauses 1-8, wherein no two transistors in the transistor chain have equivalent respective threshold voltages.

Clause 10. The semiconductor device of any combination of clauses 1-9, wherein: each transistor in the transistor chain includes: a respective control terminal; respective first and second load terminals; and a respective load path between the respective first and second load terminals; the respective load path of each of the second transistors is connected in series to the respective load path of the first transistor; the respective control terminal of each but one of the second transistors is connected to the respective second load terminal of another of the second transistors; and the respective control terminal of the one of the second transistors is connected to the respective second load terminal of the first transistor.

Clause 11. The semiconductor device of clause 10, further comprising a respective diode arranged in parallel to the respective load path of each transistor in the transistor chain.

Clause 12. A system comprising: a source; a load; a stacked switch device; and a controller configured to output a drive voltage that causes the stacked switch device to switch on and off so as to control an electrical current flowing between the source and the load, wherein: the stacked switch device includes a transistor chain comprising a first transistor connected in series to a plurality of second transistors; and each transistor in the transistor chain is located at a particular position in the transistor chain according to at least one of a respective capacitance of the transistor and a respective threshold voltage of the transistor.

Clause 13. The system of clause 12, wherein: the first transistor is located at an initial position in the transistor chain and has a greater respective capacitance than any other transistor in the transistor chain; and the second transistors are distributed at subsequent positions in the transistor chain in order from greatest respective capacitance to lowest respective capacitance.

Clause 14. The system of clause 13, wherein values of the respective capacitances of at least the initial three transistors in the transistor chain decrease linearly or logarithmically along the transistor chain, the initial three transistors including the first transistor and the next two second transistors.

Clause 15. The system of any combination of clauses 12-14, wherein: the first transistor is located at an initial position in the transistor chain and has a less negative respective threshold voltage than any other transistor in the transistor chain; and the second transistors are distributed at subsequent positions in the transistor chain in order from least negative respective threshold voltages to most negative threshold voltages.

Clause 16. The system of clause 15, wherein values of the respective threshold voltages of at least the initial three transistors in the transistor chain decrease linearly or logarithmically along the transistor chain, the initial three transistors including the first transistor and the next two second transistors.

Clause 17. The system of any combination of clauses 12-16, wherein the first transistor comprises a normally-off transistor.

Clause 18. A power circuit comprising: an arrangement of switches that include a first switch connected in series to a plurality of second switches, wherein each switch in the arrangement of switches is located at a particular position in the arrangement according to at least one of a respective capacitance of the switch and a respective threshold voltage of the switch.

Clause 19. The power circuit of clause 18, wherein: the switches in the arrangement of switches are arranged in order according from greatest respective capacitance to lowest respective capacitance; and the switches in the arrangement of switches are arranged in order according from least negative respective threshold voltage to most negative respective threshold voltage.

Clause 20. The power circuit of any of combination clauses 18-19, wherein the respective capacitance of each switch in the arrangement of switches is proportional to a size of a respective active area associated with the switch.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

What is claimed is:

1. A semiconductor device comprising:
   a transistor chain that includes a first transistor connected in series to a plurality of second transistors, the transistor chain being configured as a stacked switch device that switches on and off in response to a drive voltage, wherein:
   each transistor in the transistor chain is located at a particular position in the transistor chain according to at least one of a respective capacitance of the transistor and a respective threshold voltage of the transistor;

the first transistor is located at an initial position in the transistor chain and has a less negative respective threshold voltage than any other transistor in the transistor chain; and the second transistors are distributed at subsequent positions in the transistor chain in order from least negative respective threshold voltage to most negative respective threshold voltage.

2. The semiconductor device of claim 1, wherein:
the first transistor has a greater respective capacitance than any other transistor in the transistor chain; and
the second transistors are further distributed at the subsequent positions in the transistor chain in order from greatest respective capacitance to lowest respective capacitance.

3. The semiconductor device of claim 2, wherein the respective capacitances of at least the initial three transistors in the transistor chain decrease linearly along the transistor chain, the initial three transistors including the first transistor and the next two second transistors.

4. The semiconductor device of claim 2, wherein the respective capacitances of at least the initial three transistors in the transistor chain decrease logarithmically along the transistor chain, the initial three transistors including the first transistor and the next two second transistors.

5. The semiconductor device of claim 1, wherein values of the respective threshold voltages of at least the initial three transistors in the transistor chain decrease linearly along the transistor chain, the initial three transistors including the first transistor and the next two second transistors.

6. The semiconductor device of claim 1, wherein values of the respective threshold voltages of at least the initial three transistors in the transistor chain decrease logarithmically along the transistor chain, the initial three transistors including the first transistor and the next two second transistors.

7. The semiconductor device of claim 1, wherein no two transistors in the transistor chain have equivalent respective capacitances.

8. The semiconductor device of claim 1, wherein no two transistors in the transistor chain have equivalent respective threshold voltages.

9. The semiconductor device of claim 1, wherein:
each transistor in the transistor chain includes:
a respective control terminal;
respective first and second load terminals; and
a respective load path between the respective first and second load terminals;
the respective load path of each of the second transistors is connected in series to the respective load path of the first transistor;
the respective control terminal of each but one of the second transistors is connected to the respective second load terminal of another of the second transistors; and
the respective control terminal of the one of the second transistors is connected to the respective second load terminal of the first transistor.

10. The semiconductor device of claim 9, further comprising a respective diode arranged in parallel to the respective load path of each transistor in the transistor chain.

11. A system comprising:
a source;
a load;
a stacked switch device; and
a controller configured to output a drive voltage that causes the stacked switch device to switch on and off so as to control an electrical current flowing between the source and the load, wherein:
the stacked switch device includes a transistor chain comprising a first transistor connected in series to a plurality of second transistors; and
each transistor in the transistor chain is located at a particular position in the transistor chain according to at least one of a respective capacitance of the transistor and a respective threshold voltage of the transistor
the first transistor is located at an initial position in the transistor chain and has a greater respective capacitance than any other transistor in the transistor chain;
the second transistors are distributed at subsequent positions in the transistor chain in order from greatest respective capacitance to lowest respective capacitance; and
the respective capacitances of at least the initial three transistors in the transistor chain decreases linearly or logarithmically along the transistor chain, the initial three transistors including the first transistor and the next two second transistors.

12. The system of claim 11, wherein:
the first transistor has a less negative respective threshold voltage than any other transistor in the transistor chain; and
the second transistors are further distributed at the subsequent positions in the transistor chain in order from least negative respective threshold voltages to most negative threshold voltages.

13. The system of claim 12, wherein values of the respective threshold voltages of the at least the initial three transistors in the transistor chain decrease linearly or logarithmically along the transistor chain.

14. The system of claim 11, wherein the first transistor comprises a normally-off transistor.

15. A power circuit comprising:
an arrangement of switches that include a first switch connected in series to a plurality of second switches, wherein: each switch in the arrangement of switches is located at a particular position in the arrangement according to at least one of a respective capacitance of the switch and a respective threshold voltage of the switch, the switches in the arrangement of switches are arranged in order according from greatest respective capacitance to lowest respective capacitance, and the switches in the arrangement of switches are arranged in order according from least negative respective threshold voltage to most negative respective threshold voltage.

16. The power circuit of claim 15, wherein the respective capacitance of each switch in the arrangement of switches is proportional to a size of a respective active area associated with the switch.

* * * * *